United States Patent
Fredeman et al.

(10) Patent No.: US 9,748,958 B2
(45) Date of Patent: Aug. 29, 2017

(54) DYNAMIC HIGH VOLTAGE DRIVER WITH ADJUSTABLE CLAMPED OUTPUT LEVEL

(71) Applicant: International Business Machines Corporation, Armonk, NY (US)

(72) Inventors: Gregory J. Fredeman, Wappingers Falls, NY (US); Abraham Mathews, Austin, TX (US); Donald W. Plass, Poughkeepsie, NY (US); Kenneth J. Reyer, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/052,644

(22) Filed: Feb. 24, 2016

(65) Prior Publication Data
US 2016/0352336 A1 Dec. 1, 2016

Related U.S. Application Data

(60) Provisional application No. 62/168,480, filed on May 29, 2015.

(51) Int. Cl.
*H03K 5/00* (2006.01)
*H03K 19/0185* (2006.01)
*H03K 5/08* (2006.01)

(52) U.S. Cl.
CPC ....... *H03K 19/018521* (2013.01); *H03K 5/08* (2013.01)

(58) Field of Classification Search
CPC .......................... H03K 5/08; H03K 19/018521

USPC .................. 327/306, 333; 326/61–62, 80–81
See application file for complete search history.

(56) References Cited

U.S. PATENT DOCUMENTS

| | | | |
|---|---|---|---|
| 4,987,318 A | 1/1991 | Burke et al. | |
| 5,559,464 A * | 9/1996 | Orii ...................... | H03K 17/102 326/80 |
| 6,005,438 A | 12/1999 | Shing | |
| 6,255,850 B1 | 7/2001 | Turner | |
| 6,353,524 B1 | 3/2002 | Sloan | |
| 6,566,930 B1 * | 5/2003 | Sato ................. | H03K 3/356113 326/68 |
| 6,836,148 B2 | 12/2004 | Pullen et al. | |
| 7,268,588 B2 | 9/2007 | Sanchez et al. | |
| 7,605,618 B2 | 10/2009 | Srinivas et al. | |
| 7,737,734 B1 | 6/2010 | Khamesra et al. | |
| 7,812,641 B2 | 10/2010 | Danesh et al. | |
| 8,169,234 B1 * | 5/2012 | Bourstein ............ | H03K 3/0375 326/68 |
| 8,736,305 B2 | 5/2014 | Monga | |

(Continued)

OTHER PUBLICATIONS

IBM "A Multi-Functional Driver Module for a High-Speed Differential Transmitter", IP.Com No. 000169983, May 5, 2008, 14 pages.

*Primary Examiner* — Dinh T Le
(74) *Attorney, Agent, or Firm* — Patterson + Sheridan, LLP

(57) ABSTRACT

A driver circuit and associated techniques include managing voltage driving an electronic device. An input signal having a first voltage level is received. Processes may perform level shifting of the first voltage level to a second voltage level. The second voltage level may be clamped, for instance, but a diode circuit. The second output voltage level may be programmable, as may be current and resistance levels of the driver circuit.

20 Claims, 3 Drawing Sheets

(56) References Cited

U.S. PATENT DOCUMENTS 9,025,403 B1 5/2015 Fredeman et al.
2013/0162294 A1* 6/2013 Henmi ........... H03K 19/018507
326/80

* cited by examiner

DYNAMIC HIGH VOLTAGE DRIVER WITH ADJUSTABLE CLAMPED OUTPUT LEVEL

I. CROSS REFERENCE TO RELATED APPLICATIONS

This application claims priority from U.S. Provisional Patent Application No. 62/168,480, entitled "DYNAMIC HIGH VOLTAGE DRIVER WITH ADJUSTABLE CLAMPED OUTPUT LEVEL," filed on May 29, 2015, which is incorporated herein in its entirety.

II. FIELD OF THE DISCLOSURE

The present disclosure relates generally to computing hardware systems, and more particularly, to methods and systems associated with driver circuits.

III. BACKGROUND

In electronics, a driver is an electrical circuit or other electronic component used to control another circuit or component, such as a high-power transistor, liquid crystal display (LCD), and numerous others. Electronic components have reliability constraints corresponding to maximum voltage levels under which they can operate. Exceeding the maximum voltage across two terminals of a component can result in faulty performance and damage to the component. Conventional drivers can have thick oxide circuitry that that raises the voltage levels above acceptable reliability constraints.

IV. SUMMARY OF THE DISCLOSURE

A driver circuit and associated techniques may include managing voltage driving an electronic device. An input signal having a first voltage level is received. Processes may perform level shifting of the first voltage level to a second voltage level. The second voltage level may be clamped, for instance, using a diode circuit. The second output voltage level may be programmable, as may be current and resistance levels of the driver circuit According to a particular embodiment, a method includes receiving an input signal having a first voltage level and level shifting the first voltage level to a second voltage level. The method further includes clamping the second voltage level.

According to another particular embodiment, an apparatus includes an input signal having a first voltage level. Level shifting circuitry may level shift the first voltage level to a second voltage level. Clamping circuitry may clamp the second voltage level.

According to another particular embodiment, a computer-readable storage medium comprising operational instructions that, when executed by a processor, cause the processor to receive an input signal having a first voltage level and to level shift the first voltage level to a second voltage level. The processor may further initiate clamping the second voltage level.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

V. BRIEF DESCRIPTION OF THE DRAWINGS

VI. DETAILED DESCRIPTION

An embodiment of a system includes a high voltage driver having a programmable clamped output high level with a current limiting mechanism. Programmability may allow for incremental adjustments to fine tune operation. The system may use thin oxide devices, e.g., field effect transistors (FETs), to keep voltages operating within reliability constraints. Embodiments may avoid using thick oxides associated with high voltage.

An embodiment of the high voltage driver may use a level shifting technique that uses thin oxide devices. An output high level may be clamped to a known level using a diode connected NFET. The system may be programmed to limit current. The output may be programmably and adjustably set and clamped using an NFET diode and programmable resistance.

An embodiment of the voltage driver may handle relatively high voltages. The embodiment may be programmable to trim the driver output level. A PFET control switch may be used to shift the voltage level.

An embodiment may include level shifting. A level may include one of a number of states that a signal can have. Logic levels may be represented by the voltage difference between the signal and ground, in one implementation. The system may use circuitry to shift a first level to another level.

An embodiment includes a dynamic high voltage driver with an adjustable clamped output level realized using a level shifting technique and thin oxide devices. An output high level may be clamped to a known level using a diode connected n-channel field-effect transistor (NFET). The system may include programmable current limiting and programmable output clamp levels. For this purpose, the system may use an NFET diode and programmable resistance. The dynamic voltage driver may be used to regulate voltage present and current flowing through a circuit.

An embodiment of the system provides a programmable driver without requiring a dedicated, additional power supply. Performance tracking (i.e., rise and fall) with other signals may be achieved without regulated up levels.

Figure 1:
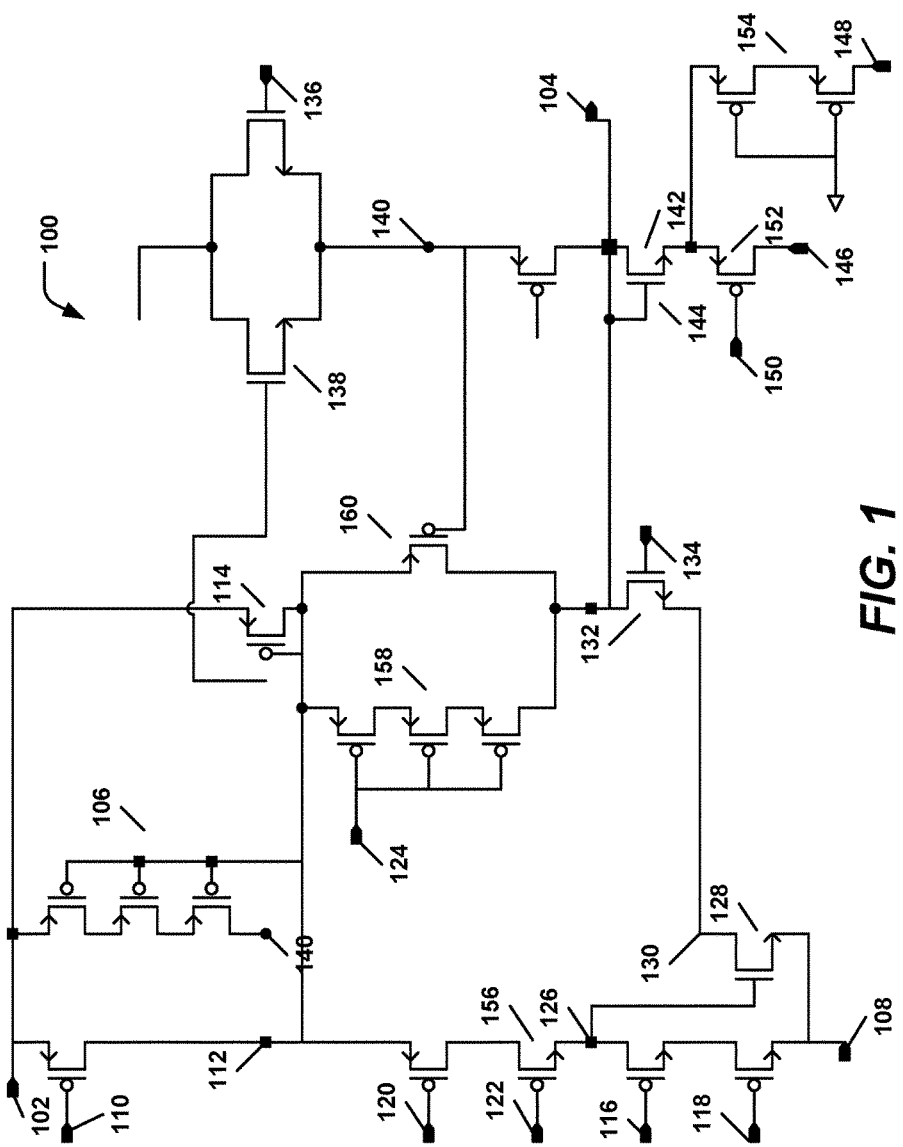
FIG. 1 is an embodiment of a circuit diagram of a programmable driver configured to perform level shifting and voltage clamping.

Turning more particularly to the Drawings, FIG. 1 is a circuit diagram showing an embodiment of a dynamic driver system 100 configured to level shift and clamp voltage. The system 100 may be programmable in that it may shift voltages by several millivolts (mV). The system 100 may additionally include a current limiting mechanism to limit consumption.

A high input voltage node 102 of the system 100 may be at a different level than a voltage level at an output voltage node 104 of the system 100. The system 100 may receive inputs at certain voltage level and may level shift the voltage level to a higher or lower to drive a device, such as a dynamic random-access memory (not shown). The voltage level may be clamped at the higher or lower level.

An input portion of the system 100 may be positioned to the left of a keep mechanism 106, with an output portion positioned to the left. In an example, the high voltage input node 102 may have a voltage of around 1.6V, and a low voltage input node 108 may have a voltage of −0.3V.

A signal at node 110 is used for precharging node 140. Under ideal conditions, voltage at node 110 is low, and a voltage at node 112 is at the level of the high voltage input node 102. The node 112 is connected to a p-channel field-effect transistor (PFET) 114 that is off when high voltage is present at node 112.

Input signals 116, 118 may enable the driver circuit 100. When both input signals 116, 118 are low/off, the node 112 is high (precharged), and output voltage node 104 may be low.

Biasing voltages 120, 122 may constantly bias the system 100. The biasing voltages 120, 122 may prevent the voltage of the high input voltage node 102 from coming into contact with the low input voltage node 108. In an example, biasing voltage 120 may be at 0.4V, and biasing voltage 122 may be at 0.8V.

When precharged a voltage at node 126 may be at the voltage of node 122 because it cannot go higher than bias voltage (e.g., 0.8V). In response, the NFET 128 turns on, and node 130 may go to the voltage level of the low input voltage node 108.

Current may flow to an NFET 132 that is connected to a biasing node 134. In an example, the biasing node 134 has a constant reference voltage of 0.8V causing the node 104 to be at the same low voltage level as node 108 in off state.

An output current injector 136 may have biased high during off state. An NFET 138 is connected to the node 112 and to the output current injector 136.

When the node 112 is high, the output current injector 136 is also high and the system 100 is in the off state. Voltage at a reference node 140 may be equal the biasing voltage 120 (e.g., 0.4V). When the system 100 is in the off state, the three-stack PFETs of the keep mechanism 106 are low. In this manner, the keep mechanism 106 may use dynamic feedback to keep the voltage at node 112 at the voltage level of the high input voltage node 102.

A clamping diode 142 hangs on the output voltage node 104. The clamping diode 142 may include an NFET 144 having a drain and gate connected to the output voltage node 104. The clamping diode 142 may define an upper level in the on state and in off state node 104 voltage level is same as node 108 which is −0.3V.

The clamping diode 142 may selectively receive voltages (e.g., 0.8V each) from two sources 146, 148. This selectivity may provide programmability. Voltage source 150 may be low. When the voltage source 150 is on, a PFET 152 is on. The clamping diode 142 will be at the voltage 146 (e.g., 0.8). When the voltage source 150 is off, the PFET 152 may go dormant, and the clamping diode 142 will get a slightly lower voltage from a two stack PFETs 154 connected to 148. This provides programmability in that the voltage may be slightly adjusted by selectively turning the PFET 152 on or off.

When the system 100 is in the on state, the node 110 may be at the high input voltage node 102. The keep mechanism 106 and the node 112 may start holding. The input signals 116, 118 may be increased to that of the voltage source 122. The node 126 may have a voltage of the low input voltage node 108. This condition may turn off the NFET 128 of the node 130.

PFET 156 may be on because due to the constant biasing voltage (e.g., 0.8V) at 122. The voltage at node 112 may become that of the low input bias voltage node 120.

Because the biasing voltage 120 is also on (e.g., with a constant 0.4V), the voltage at node 112 becomes 0.4 the when the input signals 116, 118 are fired. The high input voltage node 102 is high and the precharge is off. As such, node 112 may be at the voltage of biasing voltage 120 (e.g., 0.4V). At that point, the PFET 114 may turn on and begin charging. The PFET 114 may be selectively receive different voltages and currents based on the resistance of selected paths. A first path includes three stacked PFETs 158, and the alternate path includes one PFET 160.

The node 112 may be at the biasing voltage 120 (e.g., 0.4V), so the PFET 114 is on and current is flowing. Because node 112 is off, the output current injector 138 turns off. The voltage at the output voltage node 104 may start to rise to that of the voltage at the high input voltage node 102. However, the voltage at the output voltage node 104 is clamped so it will not reach the voltage level of the high input voltage node 102. In an example, the clamping diode 142 may clamp the voltage (e.g., 0.8V) at that of the source 146, plus a threshold voltage (e.g., 0.4V) of the NFET 144 (e.g., for a total of 1.2V). The rising output node 104 may cause the node 140 to rise, turning off the device 160 and reducing the output current through the feedback mechanism. The stack device 158 allows a small current to flow when 160 is shut off with the output node 104 clamped high.

Figure 2:
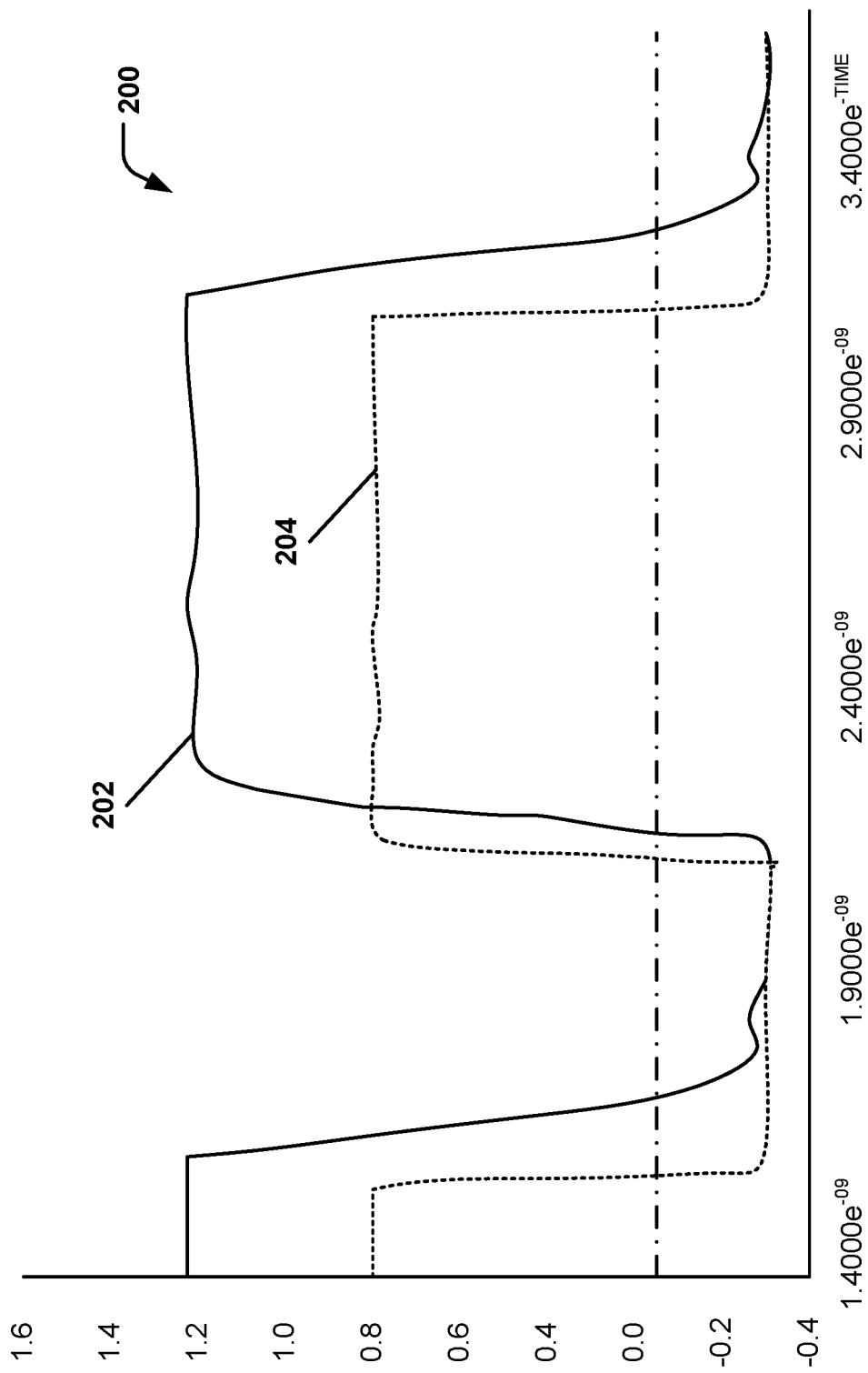
FIG. 2 shows a graph plotting a voltage of an output voltage node, such as the output voltage node f FIG. 1, versus a voltage associated with an input signal, such as the input signal of FIG. 1.

FIG. 2 shows a graph 200 plotting the voltage of the output voltage node, such as the output voltage node 104 of FIG. 1. The voltage 202 is lower than the 1.6V associated with the high input voltage node 102 of FIG. 1. The graph 200 also shows a voltage 204 associated with an input signal, such as the input signal 146 of FIG. 1.

Figure 3:
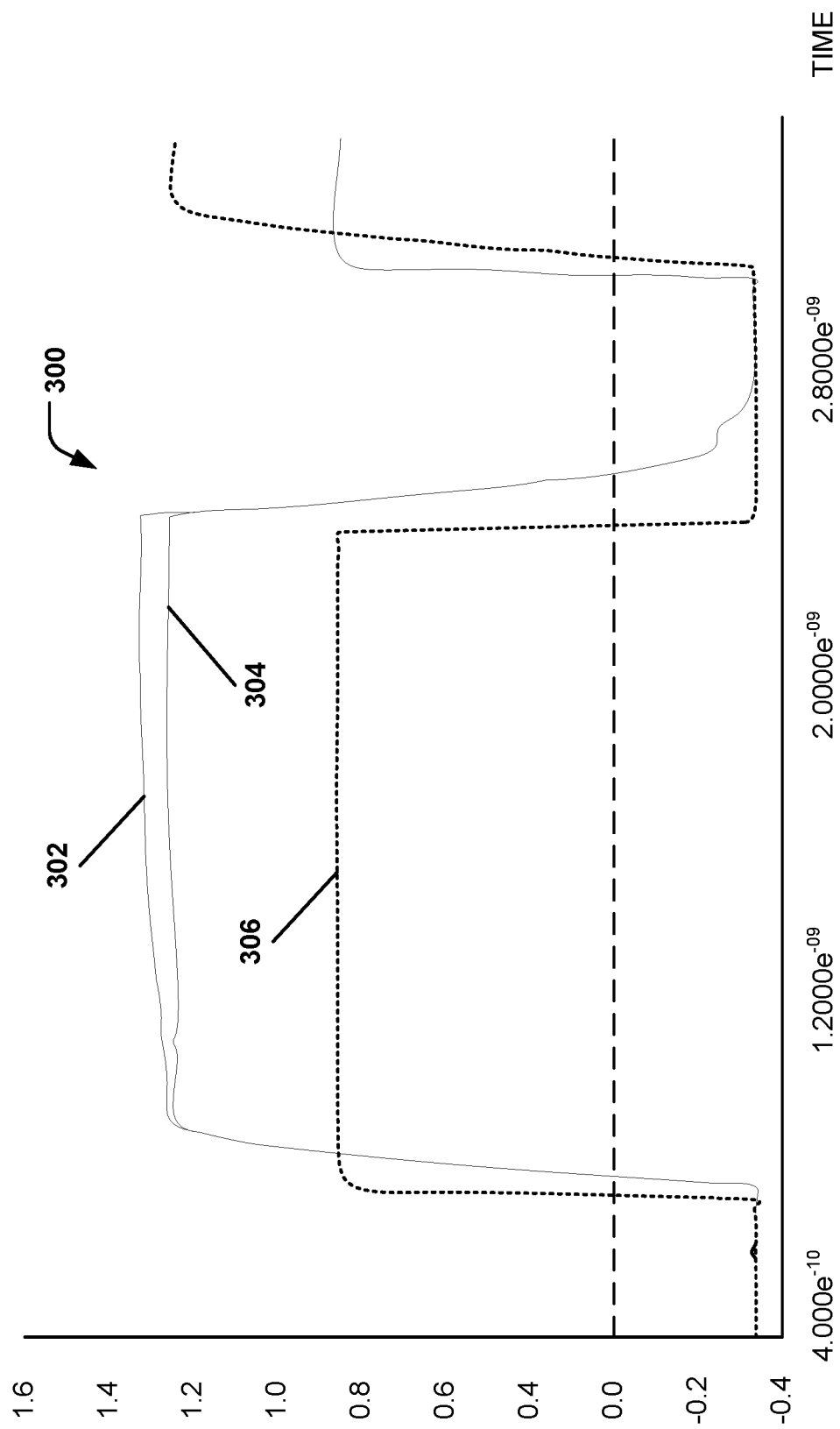
FIG. 3 shows a graph of voltage plots illustrating how a high output level of voltage may be adjusted incrementally.

FIG. 3 shows a graph 300 of voltage plots 302, 304 illustrating how a high output level of voltage may be adjusted incrementally. As shown, the high output level may be adjusted between 1.31 V and 1.24 volts as desired. The graph 300 also shows a voltage 306 associated with an input signal, such as the input signal 146 of FIG. 1.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowcharts and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

Integrated circuits or chips that may be designed and/or fabricated in accordance with the described techniques can be distributed by a fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to explain the principles of the embodiments, the practical application or technical improvement over technologies found in the marketplace, or to enable others of ordinary skill in the art to understand the embodiments disclosed herein.

Those skilled in the art can make numerous uses and modifications of and departures from the apparatus and techniques disclosed herein without departing from the described concepts. For example, components or features illustrated or described in the present disclosure are not limited to the illustrated or described locations, settings, or contexts. Examples of apparatuses in accordance with the present disclosure can include all, fewer, or different components than those described with reference to one or more of the preceding figures. The present disclosure is therefore not to be limited to specific implementations described herein, but rather is to be accorded the broadest scope possible consistent with the appended claims, and equivalents thereof.

The invention claimed is:

1. A method of managing voltage driving an electronic device, the method comprising:

receiving an input signal having a first voltage;

level shifting the first voltage to a second voltage at an output; and clamping the second voltage using clamping circuitry, wherein the clamping circuitry comprises a programmable input for adjusting the second voltage at the output.

2. The method of claim 1, wherein the clamping circuitry further comprises a diode to clamp the second voltage, wherein the diode is coupled at a first end to the output and at a second end to the programmable input.

3. The method of claim 2, wherein the diode comprises a first field effect transistor and wherein the programmable input comprises (i) a second field effect transistor coupled to a first voltage source and to the first field effect transistor and (ii) two stacked transistors coupled to a second voltage source, wherein the programmable input selects either the first voltage source or the second voltage source for adjusting the second voltage.

4. The method of claim 1, further comprising using a field effect transistor to level shift the first voltage.

5. The method of claim 1, further comprising adjusting a resistance level.

6. The method of claim 1, further comprising adjusting the second voltage using the programmable input, wherein the programmable input comprises a first transistor coupled at a first end to a first voltage source and coupled at a second end to a stacked transistor pair, wherein the stacked transistor pair is coupled to a second voltage source, wherein the programmable input selects one of the first and second voltage sources for setting the second voltage.

7. The method of claim 1, further comprising adjusting a resistance of an electrical path used to perform the level shifting.

8. The method of claim 1, further comprising adjusting a current used to perform the level shifting.

9. The method of claim 1, further comprising providing an output signal having the second voltage to the electronic device.

10. The method of claim 1, wherein the first voltage is higher than the second voltage.

11. The method of claim 1, wherein the first voltage is lower than the second voltage.

12. The method of claim 1, using thin oxide devices to clamp the second voltage.

13. An apparatus comprising:
an input configured to receive an input signal having a first voltage;

level shifting circuitry to level shift the first voltage to a second voltage at an output of the apparatus; and clamping circuitry to clamp the second voltage at the output, wherein the clamping circuitry comprises a programmable input for adjusting the second voltage at the output.

14. The apparatus of claim 13, wherein the apparatus is a dynamic driver circuit.

15. The apparatus of claim 13, wherein the clamping circuitry comprises a diode, wherein the diode is coupled at a first end to the output and at a second end to the programmable input.

16. The apparatus of claim 13, wherein the level shifting circuitry is programmable.

17. The apparatus of claim 15, wherein the diode comprises a first field effect transistor and wherein the programmable input comprises (i) a second field effect transistor coupled to a first voltage source and to the first field effect transistor and (ii) two stacked transistors coupled to a second voltage source, wherein the programmable input selects either the first voltage source or the second voltage source for adjusting the second voltage.

18. A computer-readable storage medium comprising operational instructions that, when executed by a processor, cause the processor to:
receive an input signal having a first voltage;
level shift the first voltage to a second voltage at an output; and
clamp the second voltage using clamping circuitry, wherein the clamping circuitry comprises a programmable input for adjusting the second voltage at the output.

19. The method of claim 18, wherein the clamping circuitry further comprises a diode to clamp the second voltage, wherein the diode is coupled at a first end to the output and at a second end to the programmable input.

20. The method of claim 19, wherein the diode comprises a first field effect transistor and wherein the programmable input comprises (i) a second field effect transistor coupled to a first voltage source and to the first field effect transistor and (ii) two stacked transistors coupled to a second voltage source, wherein the programmable input selects either the first voltage source or the second voltage source for adjusting the second voltage.

* * * * *